(12) United States Patent
Chou et al.

(10) Patent No.: US 10,615,785 B1
(45) Date of Patent: Apr. 7, 2020

(54) FULLY COMPENSATED COMPLEMENTARY DUTY CYCLE CORRECTION CIRCUITS

(71) Applicant: QUALCOMM Incorporated, San Diego, CA (US)

(72) Inventors: Shih-Wei Chou, San Diego, CA (US); Ying Duan, San Diego, CA (US); Abhay Dixit, San Diego, CA (US); Harry Huy Dang, San Diego, CA (US); Thomas Clark Bryan, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/360,912

(22) Filed: Mar. 21, 2019

(51) Int. Cl.
  *H03K 5/156* (2006.01)
  *H03K 3/356* (2006.01)
  *H03K 5/24* (2006.01)

(52) U.S. Cl.
  CPC ..... *H03K 5/1565* (2013.01); *H03K 3/356104* (2013.01); *H03K 5/2472* (2013.01)

(58) Field of Classification Search
  CPC ........ H03K 5/156; H03K 5/1565; H03K 5/22; H03K 5/24; H03K 5/2472; H03K 5/2481; H03K 5/249; H03K 3/02; H03K 3/353; H03K 3/356; H03K 3/356104; H03K 3/356113; H03K 3/356121; H03K 3/35613; H03K 3/356139; H03K 3/356147; H03K 3/356156
  See application file for complete search history.

(56) References Cited

U.S. PATENT DOCUMENTS

2004/0070459 A1\* 4/2004 Motoyama ........... H03K 3/0315
                                                   331/57
2013/0229216 A1\* 9/2013 Wu ........................ H03K 5/06
                                                   327/175

\* cited by examiner

*Primary Examiner* — Lincoln D Donovan
*Assistant Examiner* — Diana J. Cheng
(74) *Attorney, Agent, or Firm* — Haynes and Boone, LLP (36340)

(57) ABSTRACT

Duty cycle correction circuits are provided that include a serial combination of a first inverter and a second inverter for inverting an input clock signal into an output clock signal having a corrected duty cycle. The duty cycle correction circuits also include a serial combination of a third inverter and a fourth inverter for inverting a complement input clock signal into a complement output clock signal having a corrected duty cycle.

20 Claims, 6 Drawing Sheets

FULLY COMPENSATED COMPLEMENTARY DUTY CYCLE CORRECTION CIRCUITS

TECHNICAL FIELD

This application relates to duty cycle correction, and more particularly to fully compensated complementary duty cycle correction circuits.

BACKGROUND

It is conventional to control the duty cycle of a clock signal for clocking a digital system with a duty cycle correction circuit. For example, double data rate (DDR) transmission uses both the falling edge and the rising edge of a DDR clock signal for data transmission and reception. The data rate for a DDR system is thus twice that as for a single-clock-edge system at the same clocking frequency. Although the use of DDR is thus quite popular, its use faces a number of challenges due to its more stringent timing requirements as compared to single edge data transmission. For example, the DDR clock should have a 50% duty cycle. One can readily appreciate why in that a 50-50 split of the duty cycle for the rising/falling edges of the clock allows the receiver and transmitter the most time possible with each clock edge. As the duty cycle strays from this ideal 50-50 split, one of the clock states has less of each clock cycle than the remaining state. The data eye for the receiver then begins to collapse for the shortened clock state, which leads to undesirable data transmission errors.

Given the importance of obtaining a 50% duty cycle, various duty cycle correcting circuits have been implemented. A conventional duty cycle clock correction circuit 100 is shown in FIG. 1A. A first inverter 105 with a variable pull-up resistance and a variable pull-down resistance inverts an input clock (clk in) to produce a complement output clock signal (clkb out). The core of first inverter 105 is formed by a serial combination of a p-type metal-oxide-semiconductor (PMOS) inverter transistor P1 and an n-type metal-oxide-semiconductor (NMOS inverter transistor M1. If the source of inverter transistor P1 connected directly to a power supply node for a power supply voltage VDD, the pull-up resistance for first inverter 105 would be determined by the on-resistance for inverter transistor P1. To provide a variable pull-up resistance, the source of transistor P1 instead couples to the power supply node through a PMOS pull-up transistor P2 coupled in parallel with a variable-resistance transistor P3 formed as a parallel combination of (N+1) PMOS transistors starting from a zeroth transistor $P3_0$ through an Nth transistor $P3_N$, where N is a plural positive integer. An active low enable signal (enb) drives the gate of pull-up transistor P2 so that it is switched on during normal operation for first inverter 105. A first pull-up tuning signal Ctrlbp<0:N> controls which of the transistors $P3_0$ through $P3_N$ conduct. As more of these transistors conduct, the variable pull-up resistance for first inverter 105 lowers. Conversely, as fewer of the transistors $P3_0$ through $P3_N$ conduct, the variable pull-up resistance increases. Since pull-up transistor P2 is always on during normal operation, first inverter 105 is powered regardless of the state for the first pull-up tuning signal.

The variable pull-down resistance for first inverter 105 is controlled in an analogous fashion by a first pull-down tuning signal Ctrln<0:N> that controls a variable-resistance transistor M3 formed as a parallel combination of (N+1) NMOS transistors starting from a zeroth transistor $M3_0$ through an Nth transistor $M3_N$. These transistors are arranged in parallel with a pull-down NMOS transistor M2 having its gate controlled by an active-high enable signal (en) during normal operation.

A second inverter 110 with a variable pull-up resistance and a variable pull-down resistance inverts a complement input clock signal (clkb in) to form a clock output signal (clk out). The core of second inverter 110 is formed by a serial combination of a PMOS inverter transistor P4 and an NMOS inverter transistor M4. The source of inverter transistor P4 couples to the power supply node through a pull-up PMOS transistor P5 coupled in parallel with a variable-resistance PMOS transistor P6 formed as a parallel combination of (N+1) transistors starting from a zeroth transistor $P6_0$ through an Nth transistor $P6_N$. A second pull-up tuning signal ctrlbn<0:1> controls which of the P6 transistors are conducting to control the variable pull-up resistance for second inverter 110. The source of inverter transistor M4 couples to ground through a pull-down NMOS transistor M5 and a variable-resistance NMOS transistor M6 formed as a parallel combination of (N+1) NMOS transistors starting from a zeroth transistor $M6_0$ through an Nth transistor $M6_N$. A second pull-down tuning signal Ctrl<0:N> controls which of the transistors M6 are conducting to control the variable pull-down resistance for second inverter 110.

The control of the duty cycle for the clock output signal by duty cycle correction circuit 100 may be better appreciated with reference to the clock waveforms shown in FIG. 1B. The duty cycle for the clock input signal (Clk in) is less than 50%. The complement input clock signal thus has a duty cycle greater than 50%. The variable pull-up resistance for first inverter 105 is thus increased so that a slope for a rising edge for the complement output signal (clkb out) is dampened or slowed. The duty cycle for the complement output signal is thus decreased to equal the desired 50% value. Conversely, the variable pull-down resistance for second inverter 110 is increased so that that a slope for the falling edges for the clock output signal (clk out) is lowered. The duty cycle for the output clock signal is thus increased to equal the desired 50% value.

Although operation of duty cycle correction circuit 100 thus achieves the desired duty cycle correction, note that this correction is only achieved at typical process, voltage, and temperature corners. At more extreme process corners, such as a fast NMOS/slow PMOS corner or a slow NMOS/fast PMOS corner, duty cycle correction circuit 100 cannot obtain the desired duty cycle correction without some duty cycle distortion across the various process corners. Accordingly, there is a need in the art for improved duty cycle correction circuits with reduced duty cycle distortion across a wide range of process, voltage, and temperature variations.

SUMMARY

Duty cycle correction circuits are provided that include a first pair of inverters and also a second pair of inverters. The first pair of the inverters is formed by a first inverter arranged in serial with a second inverter to invert an input clock signal into an output clock signal having a corrected duty cycle. The second pair of inverters is similarly formed by a third inverter arranged in series with a fourth inverter to invert a complement input clock signal into a complement output clock signal having the corrected duty cycle. Each inverter has a variable pull-up resistance and a variable pull-up resistance that may both be tuned as necessary to provide the desired duty cycle correction.

The variable pull-up resistance for the first inverter is responsive to a first pull-up tuning signal. Similarly, the variable pull-down resistance for the first inverter is responsive to a first pull-down tuning signal. A second pull-up tuning signal tunes the variable pull-up resistance for the third inverter whereas a second pull-down tuning signal tunes the variable pull-down resistance for the third inverter. The second pull-up tuning signal also tunes the variable pull-up resistance for the second inverter. Similarly, the second pull-down tuning signal also tunes the variable pull-down resistance for the second inverter. The tuning for the fourth inverter is analogous in that it is controlled by the first pull-up tuning signal and the first pull-up tuning signal.

The resulting tuning symmetry for the four inverters is quite advantageous as it provides for a symmetric tuning of both the rising and falling edges for the output clock signal and also the rising and falling edges of the complement output clock signal. This symmetric tuning provides a robust duty cycle correction that reduces the duty cycle distortion for a wide range of process, voltage, and temperature corners.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1A:
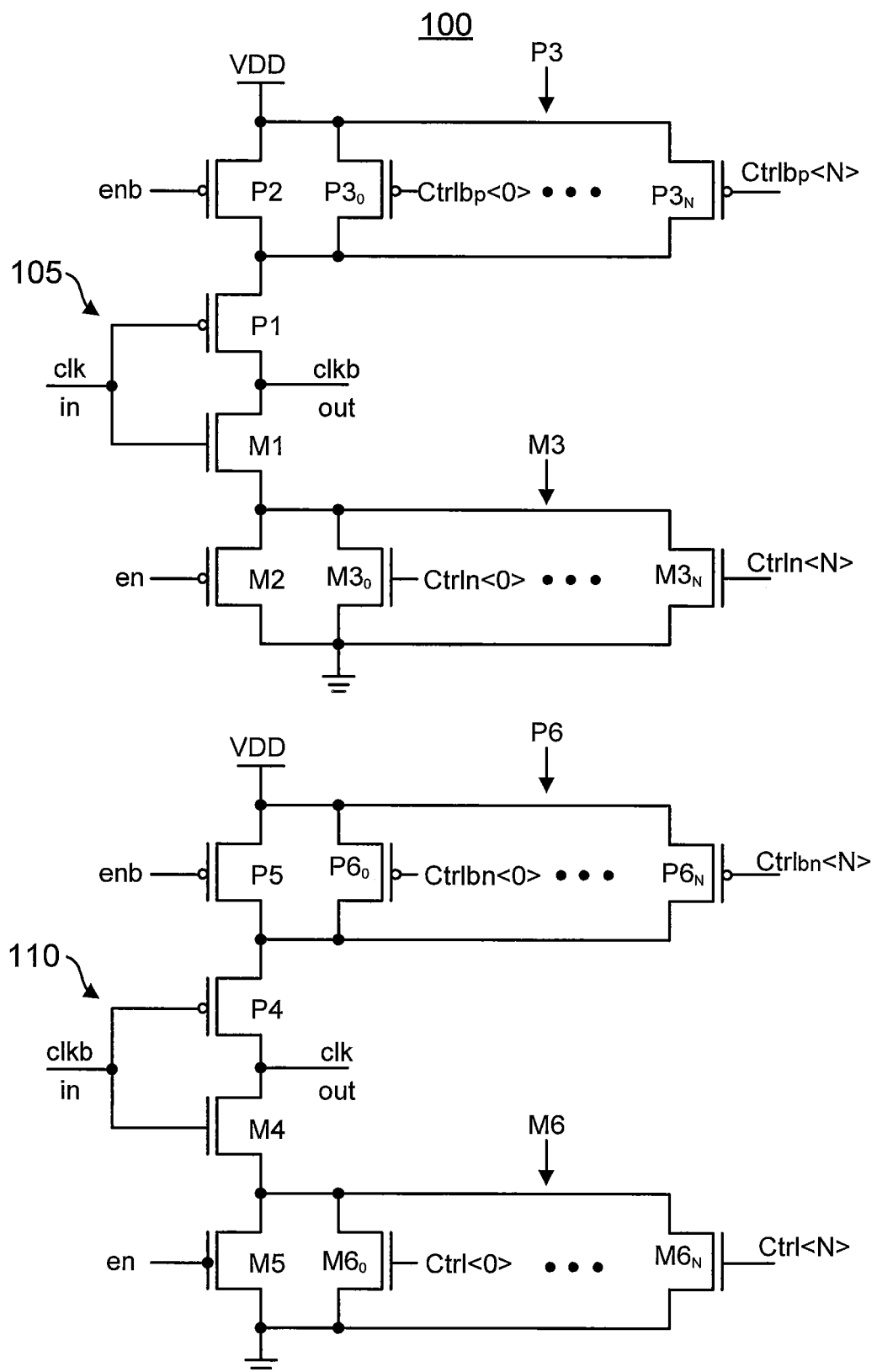
FIG. 1A illustrates a conventional duty cycle correction circuit.
Figure 1B:
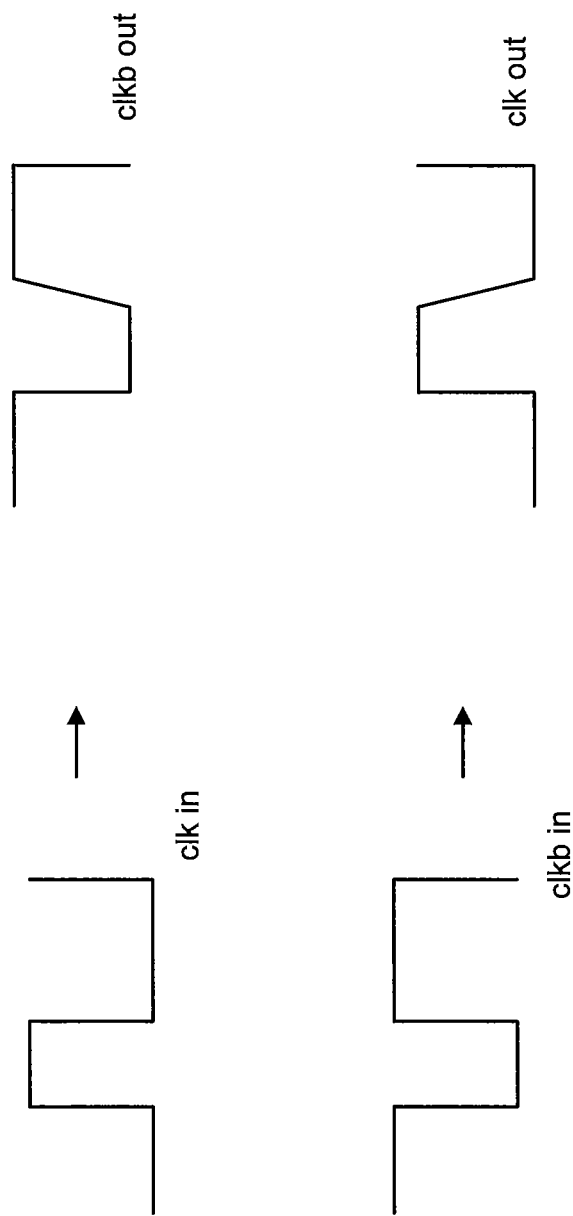
FIG. 1B illustrates some input and output clock waveforms for the conventional duty cycle correction circuit of FIG. 1A.

Duty cycle correction circuits are provided that include a first inverter having a variable pull-up resistance and a variable pull-down resistance. As used herein, a "variable pull-up resistance" for an inverter refers to the resistance between a power supply node for the inverter and a node for its output signal. The variable pull-up resistance thus affects the strength of a rising edge for a clock signal produced by an inverter. The weaker the variable pull-up resistance, the steeper is the slope for the rising edge as the inverter charges its output clock signal to the power supply voltage carried on the power supply node. Conversely, the stronger the variable pull-up resistance, the more the slope for the rising edge is reduced. As used herein, a "variable pull-down resistance" for an inverter refers to the resistance between the inverter's output node and ground. The weaker the variable pull-down resistance, the steeper in the slope for the falling edge for the output clock signal from the inverter. Conversely, the stronger the variable pull-down resistance, the more the slope for the falling edge is reduced.

The first inverter inverts an input clock signal to produce an intermediate complement clock signal. The intermediate complement clock signal is referred to herein as intermediate because it not an output clock signal for the duty cycle correction circuit. A tuning for the variable pull-up and pull-down resistance for the first inverter depends upon a duty cycle for the input clock signal. In the following discussion, it will be assumed that a desired duty cycle is 50% but it will be appreciated that the disclosed duty cycle correction circuits and techniques may be readily adapted to provide whatever duty cycle is desired for the output clock signals. Depending upon the tuning, the variable pull-up and pull-down resistances each have a default resistance value. In the following discussion, it will be assumed that the default resistance is the minimum value in a tuning resistance range but the default resistance can be varied in alternative implementations.

If the duty cycle for the input clock signal is too small, the variable pull-up resistance is increased from its default value. The variable pull-down resistance may then remain at its default value. The slope for the rising edges in the intermediate complement clock signal would decrease in response to this increase in the pull-up resistance. Note that a "rising edge" as used herein refers to the clock signal phase in transition from its voltage low state (such as ground) to its voltage high state (e.g., the power supply voltage VDD). Conversely, if the duty cycle for the input clock signal is too large, the variable pull-down resistance is increased from its default value. The variable pull-up resistance may then remain at its default value. The slope for the falling edges in the intermediate complement clock signal would then be decreased. Analogous to the rising edges, a "falling edge" as used herein refers to the clock signal phase in transition from its voltage high state to its voltage low state.

The duty cycle correction circuit further includes a second inverter having a variable pull-up resistance and a variable pull-down resistance. The second inverter inverts a complement input clock signal to produce an intermediate clock signal. Analogous to the first inverter, the variable pull-up and pull-down resistances for the second inverter will each have a default value in the absence of any tuning. The variable pull-up resistance and the variable pull-down resistance for the second inverter are tuned from their default values in a complementary fashion as compared to the tuning of the variable pull-up and pull-down resistances for the first inverter. For example, if the duty cycle of the input clock signal is too large, the duty cycle for the complement input clock signal will be too small. In that case, the variable pull-up resistance for the second inverter is increased from its default value whereas the variable pull-down resistance may stay at its default value. Conversely, if the duty cycle is too large for the complement input clock signal, the variable pull-down resistance is increased from its default value. The variable pull-down resistance may then remain at its default value.

To provide a more robust control of the duty cycle for an output clock signal, the duty cycle correction circuits disclosed herein also include a third inverter having variable pull-up and pull-down resistances. The third inverter inverts the complement intermediate clock signal from the first inverter to form the output clock signal. A fourth inverter having variable pull-up and pull-down resistances inverts the intermediate clock signal from the second inverter to form a complement output clock signal. The tuning for the variable pull-up and pull-down resistances for the third inverter match that applied to the second inverter. Similarly, the tuning for the variable pull-up and pull-down resistances for the fourth inverter match that applied to the first inverter.

The resulting duty cycle correction is quite advantageous in that it is stable over a wide range of process, voltage, and temperature variations for an integrated circuit including an implementation of the disclosed duty cycle correction circuits. For example, suppose that the duty cycle for the input clock signal is too small. In that case, the duty cycle for the complement input clock signal would be too large. Since the duty cycle for the input clock signal is too small, the variable pull-up resistance for the first inverter is increased from its default value. Conversely, the variable pull-down resistance for the second inverter is increased from its default value. Since the third inverter gets the tuning of the second inverter, a variable pull-down resistance for the third inverter is increased from its default value by the same amount applied to the variable pull-down resistance for the second inverter. The variable pull-up resistance for the fourth inverter is increased from its default value by the same amount applied to the variable pull-up resistance for the first inverter. It will be appreciated that this complementary tuning of third and fourth inverters may be varied in alternative implementations such that the increases in the pull-up or pull-down resistances does not exactly match that increase applied to the corresponding first or second inverter.

Should the duty cycle for the input clock signal be too large, the variable pull-down resistances for the first and fourth inverters is increased from their default value by the same amount. Similarly, the variable pull-up resistances for the second and third inverters would be increased from their default level by the same amount (as noted earlier, the timing of the third and fourth inverters need not be exactly matched to the tuning for the corresponding first or second inverter). Regardless of whether the duty cycle for the input clock signal is too large or too small, the adjustment of both the rising and falling edges for the output clock signal and the complement output signal provides a stable duty cycle adjustment across a wide range of process, voltage, and temperature corners.

Each of the inverters includes an inverter PMOS transistor having a drain connected to a drain of an inverter NMOS transistor. These connected drains form an output node for the inverter. The input clock signal to each inverter drives a gate for the inverter's inverter PMOS transistor and a gate for the inverter NMOS transistor. The variable pull-up resistance is implemented by a variable-resistance PMOS transistor. This variable-resistance PMOS transistor may be coupled between a source of the inverter PMOS transistor and a power supply node in a first implementation for the duty cycle correction circuit. In such an implementation, the variable-resistance PMOS transistor does not load the output node for the inverter. Alternatively, the variable-resistance PMOS transistor may be coupled in parallel with the inverter PMOS transistor in a second implementation for a duty cycle correction circuit. Although the second implementation loads the output node, it provides a larger tuning range for the variable pull-up resistance as compared to the first implementation with the same size variable-resistance PMOS transistor. Analogous to the variable-resistance PMOS transistor, a source for the inverter NMOS transistor may couple to ground through a variable-resistance NMOS transistor. Alternatively, the variable-resistance NMOS transistor may be coupled in parallel with the inverter NMOS transistor. Some example duty cycle correction circuits will now be discussed in more detail.

Figure 2:
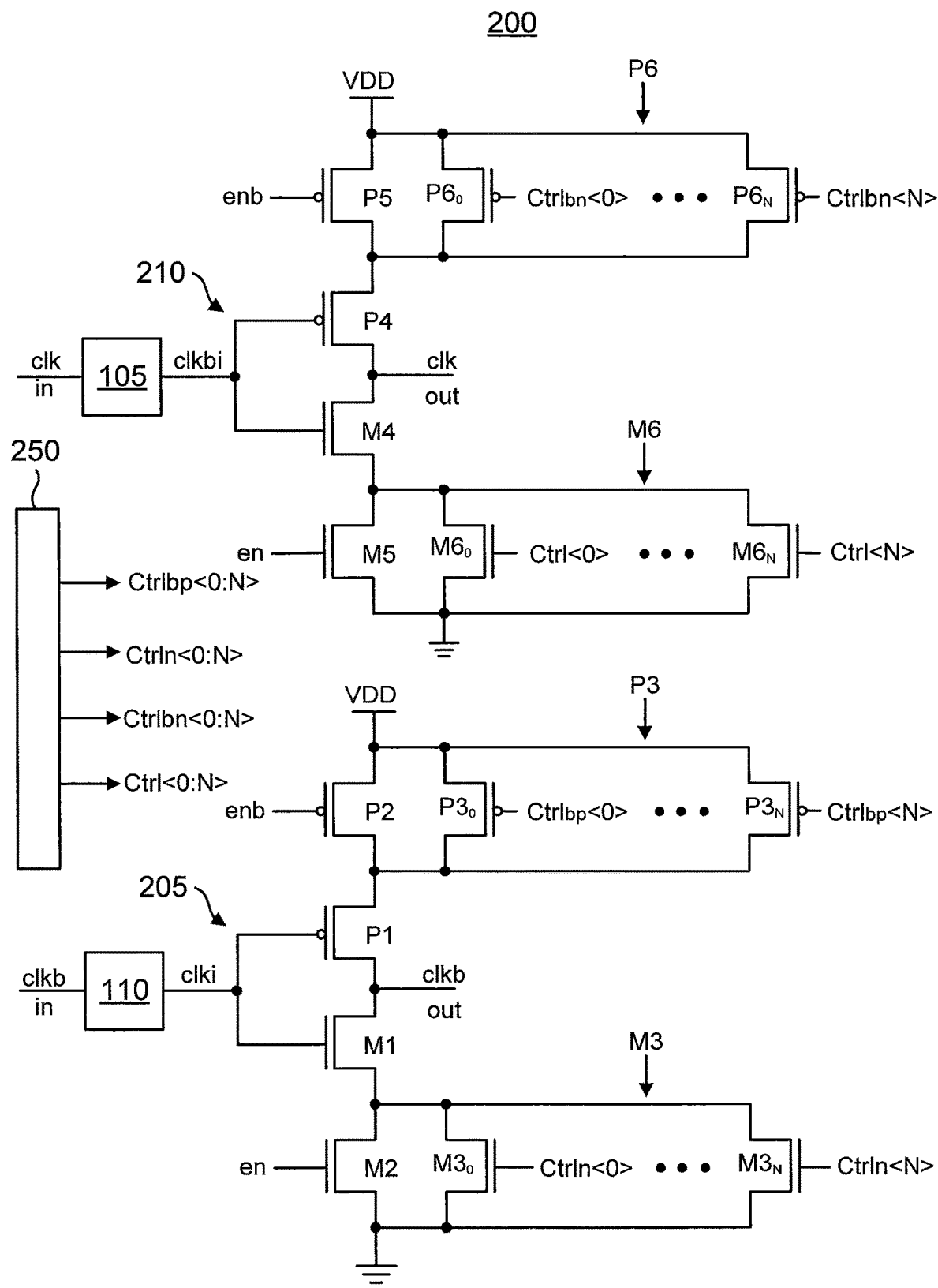
FIG. 2 illustrates a duty cycle correction circuit in accordance with an aspect of the disclosure in which variable-resistance transistors do not load the output clock signal nodes.

A duty cycle correction circuit 200 is shown in FIG. 2 in which the variable resistance tuning for both pull-up and pull-down does not directly load the output nodes for an output clock signal (clk out) and a complement output clock signal (clkb out). As discussed earlier, there are four inverters with a variable pull-up resistance and a variable pull-down resistance in duty cycle correction circuit 200. A first inverter 105 functions as discussed analogously with regard to duty cycle correction circuit 100 to invert an input clock signal (clk in). But the output of first inverter 105 in duty cycle correction circuit 200 is merely an intermediate complement clock signal (clkbi) that is inverted by a third inverter 210 to produce the output clock signal. A second inverter 110 also functions analogously as discussed with regard to duty cycle correction circuit 100 to invert a complement input clock signal (clkb in). But the output of inverter 110 in duty cycle correction circuit 200 is an intermediate clock signal (clki) that is inverted by a fourth inverter 205 to produce the complement output clock signal (clkb out).

Third inverter 210 is structurally identical to second inverter 110 except that third inverter 210 inverts the complement intermediate clock signal as opposed to inverting the complement input clock signal. Third inverter 210 thus includes an inverter PMOS transistor P4 having its drain connected to a drain of an inverter NMOS transistor M4. The source of transistor P4 couples to the power supply node through a parallel combination of a pull-up PMOS transistor P5 and a variable-resistance PMOS transistor P6. Variable-resistance transistor P6 is implemented by a plurality of (N+1) PMOS transistors ranging from a zeroth transistor $P6_0$ to an Nth transistor $P6_N$. During normal operation, pull-up transistor P5 is maintained on by an active-low complement enable signal enb. The resistance of variable-resistance transistor P6 depends upon the second pull-up tuning signal Ctrlbn<0:N>. The second pull-up tuning signal is an (N+1) bit-wide digital word. A zeroth bit (Ctrlbn<0>) of the second pull-up tuning signal drives the gate of zeroth transistor $P6_0$. Similarly, a first bit (Ctrlbn<1>) drives the gate of a first transistor $P6_1$ (not illustrated) and so on such that an Nth bit (Ctrlbn<N>) drives the gate of the Nth transistor $P6_N$.

The second pull-up tuning signal Ctrlpn<0:N> for inverter 210 depends upon the pull-up resistance tuning applied to the corresponding variable-resistance transistor P6 in second inverter 110. Should the complement input clock signal have too small of a duty cycle, one of more bits in the second pull-up tuning signal are asserted to the power supply voltage VDD to switch off their corresponding PMOS transistor in variable-resistance transistor P6 to increase the variable pull-up resistance for second inverter 110. Since the same second pull-up tuning signal is applied to third inverter 210, its variable pull-up resistance is increased by the same amount as applied to second inverter 110. The default state of the second pull-up tuning signal determines the default value for the variable pull-up resistance for second inverter 110 and also for third inverter 210. For example, the default state for the bits in the second pull-up tuning signal may be all zeroes such that all the transistors $P6_0$ through $P6_N$ are on in the default state.

The pull-down tuning for third inverter 210 is analogous. The source of inverter transistor M4 couples to the ground through a parallel combination of a pull-down NMOS transistor M5 and a variable-resistance NMOS transistor M6. Variable-resistance transistor M6 is implemented by a plurality of (N+1) NMOS transistors ranging from a zeroth transistor $M6_0$ to an Nth transistor $M6_N$. During normal operation, pull-down transistor M5 is maintained on by an active-high enable signal en (complement enable signal enb being the complement of the enable signal en). The resistance of variable-resistance transistor M6 depends upon the second pull-down tuning signal Ctrl<0:N>. This second pull-down tuning signal is an (N+1) bit-wide digital word. A zeroth bit (Ctrl<0>) of the second pull-down tuning signal drives the gate of zeroth transistor $M6_0$. Similarly, a first bit (Ctrl<1>) drives the gate of a first transistor $M6_1$ (not illustrated) and so on such that an Nth bit drives the gate of the Nth transistor $M6_N$. Depending upon which bits are grounded or asserted in the second pull-down tuning signal determines the variable pull-down resistance for third inverter 210.

The second pull-down tuning signal for third inverter 210 depends upon the variable pull-down resistance tuning applied to the corresponding variable-resistance transistor M6 in second inverter 110. Should the complement input clock signal have too large of a duty cycle, one of more bits in the second pull-up tuning signal are grounded to switch off their corresponding NMOS transistor in variable-resistance transistor M6 to increase the variable pull-down resistance for second inverter 110. Since the same second pull-up tuning signal is applied to third inverter 210, its variable pull-down resistance is increased by the same amount as applied to second inverter 110. The default state of the second pull-down tuning signal determines the default value for the variable pull-down resistance. For example, the default state may be that all the bits in the second pull-up tuning signal are binary ones such that all the transistors $P6_0$ through $P6_N$ are on in the default state.

Fourth inverter 205 is structurally identical to first inverter 105 except that it inverts the intermediate clock signal clki as opposed to inverting the input clock signal. Fourth inverter 205 thus includes an inverter PMOS transistor P1 having its drain connected to a drain of an inverter NMOS transistor M1. The source of transistor P1 couples to the power supply node through a parallel combination of a pull-up PMOS transistor P2 and a variable-resistance PMOS transistor P3. Variable-resistance transistor P3 is implemented by a plurality of (N+1) PMOS transistors ranging from a zeroth transistor $P3_0$ to an Nth transistor $P3_N$. During normal operation, pull-up transistor P2 is maintained on by the active-low complement enable signal enb. The resistance of variable-resistance transistor P3 depends upon the first pull-up tuning signal Ctrlbp<0:N>. The first pull-up tuning signal is an (N+1) bit-wide digital word. A zeroth bit (Ctrlbp<0>) of the first pull-up tuning signal drives the gate of zeroth transistor $P3_0$. Similarly, a first bit (Ctrlbp<1>) drives the gate of a first transistor $P3_1$ (not illustrated) and so on such that an Nth bit (Ctrlbp<N>) drives the gate of the Nth transistor $P3_N$.

The first pull-up tuning signal (Ctrlbp<0:N>) for fourth inverter 205 depends upon the pull-up resistance tuning applied to the corresponding variable-resistance transistor P3 in first inverter 105. Should the input clock signal have too small of a duty cycle, one of more bits in the first pull-up tuning signal are asserted to the power supply voltage VDD to switch off their corresponding PMOS transistor in variable-resistance transistor P3 to increase the variable pull-up resistance for first inverter 105. Since the same first pull-up tuning signal is applied to fourth inverter 205, its variable pull-up resistance is increased by the same amount as applied to first inverter 105. The default state of the first pull-up tuning signal determines the default value for the variable pull-up resistance for inverters 105 and 205. For example, the default state may be that the all the bits in the first pull-up tuning signal are zeroes such that all the transistors $P3_0$ through $P3_N$ are on.

The pull-down tuning for fourth inverter 205 is analogous. The source of inverter transistor M1 couples to ground through a parallel combination of a pull-down NMOS transistor M2 and a variable-resistance NMOS transistor M3. Variable-resistance transistor M3 is implemented by a plurality of (N+1) NMOS transistors ranging from a zeroth transistor $M3_0$ to an Nth transistor $M3_N$. During normal operation, pull-down transistor M2 is maintained on by the active-high enable signal en. The resistance of variable-resistance transistor M3 depends upon the first pull-down tuning signal Ctrln<0:N>. This first pull-down tuning signal is an (N+1) bit-wide digital word. A zeroth bit (Ctrln<0>) of the first pull-down tuning signal drives the gate of zeroth transistor $M3_0$. Similarly, a first bit (Ctrln<1>) drives the gate of a first transistor $M3_1$ (not illustrated) and so on such that an Nth bit (Ctrln<N>) drives the gate of the Nth transistor $M3_N$. Depending upon which bits are grounded or asserted in the first pull-down tuning signal determines the variable pull-down resistance for fourth inverter 205.

The first pull-down tuning signal for fourth inverter 205 depends upon the pull-down resistance tuning applied to the corresponding variable-resistance transistor M3 in first inverter 105. Should the input clock signal have too large of a duty cycle, one of more bits in the first pull-down tuning signal are grounded to switch off their corresponding NMOS transistor in variable-resistance transistor M3 to increase the variable pull-down resistance for first inverter 105 from its default value. Since the same first pull-down tuning signal is applied to fourth inverter 205, its variable pull-down resistance is increased by the same amount as applied to first inverter 105. The default state of the first pull-down tuning signal determines the default value for the variable pull-down resistance. For example, the default state may be that the all the bits in the first pull-down tuning signal are binary ones such that all the transistors $P3_0$ through $P3_N$ are on in the default state. A memory 250 stores the first pull-up tuning signal (Ctrlbp<0:N>), the first pull-down tuning signal (Ctrln<0:N>), the second pull-up tuning signal (Ctrlbn<0:N>), and the second pull-down tuning signal (Ctrl<0:N>) to control the pull-up and pull-down tuning for duty cycle correction circuit 200.

Figure 3:
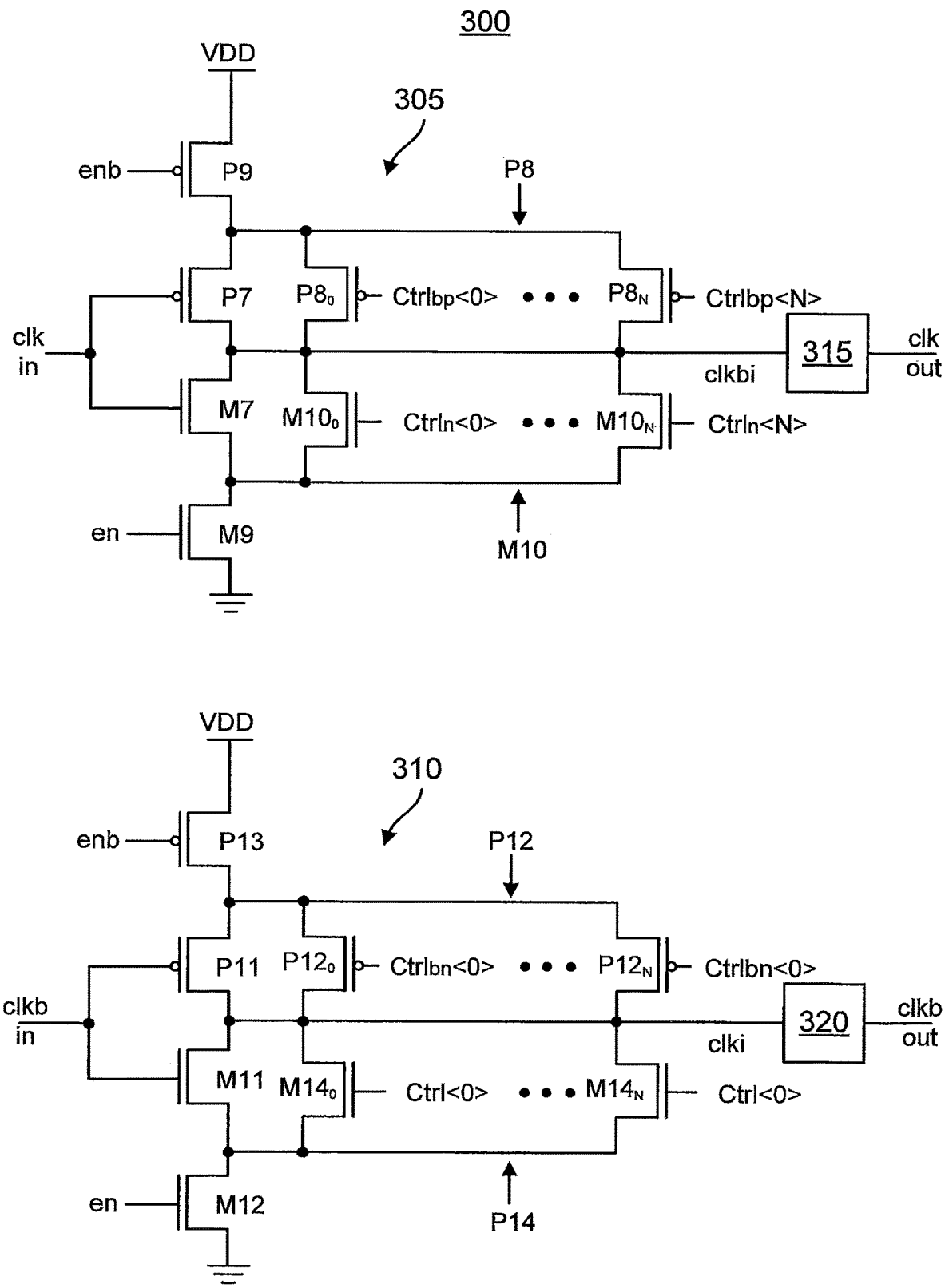
FIG. 3 illustrates a duty cycle correction circuit in accordance with an aspect of the disclosure in which variable-resistance transistors load the output clock signal nodes but provide for a greater duty cycle tuning range as compared to the duty cycle correction circuit of FIG. 2.

Duty cycle correction circuit 200 is an example of the first implementation discussed above in that the variable-resistance transistors do not directly couple to the output nodes for first inverter 105, third inverter 210, second inverter 110, and fourth inverter 205. Although the output clock signals are thus advantageously not loaded by the variable-resistance transistors, the tuning range is limited as compared to the second implementation in which the variable-resistance transistors directly couple to the output nodes. An example of the second implementation is shown in FIG. 3 for a duty cycle correction circuit 300. Analogous to duty cycle correction circuit 200, duty cycle correction circuit 300 includes four inverters, each with a variable pull-up resistance and a variable pull-down resistance. A first inverter 305 inverts the input clock signal (clk in) into an intermediate complement clock signal (clkbi) that is in turn inverted by a second inverter 315 to form the output clock signal (clk out). A third inverter 310 inverts the complement input clock signal (clkb in) into an intermediate clock signal (clki) that is turn is inverted by a fourth inverter 320 to form the complement output clock signal (clkb out).

Second inverter 315 replicates the structure of third inverter 310 and has the same pull-up or pull-down tuning. Similarly, fourth inverter 320 replicates the structure of first inverter 305 and has the same pull-up or pull-down tuning. Thus, FIG. 3 shows only the structure for first inverter 305 and third inverter 310 as the remaining inverters are duplicates but for their inputs and outputs. In first inverter 305, an inverter PMOS transistor P7 has its drain connected to a drain of an inverter NMOS transistor M7. The input clock signal drives the gates of inverter transistors P7 and M7. The source of transistor P7 connects to the power supply node through a pull-up PMOS transistor P9. The complement enable signal enb drives the gate of transistor P9 so that first inverter 305 is powered during normal operation. A variable-resistance PMOS transistor P8 couples in parallel with inverter transistor P7 between the output node for first inverter 305 and the drain of pull-up transistor P9. Variable-resistance transistor P8 is implemented by a plurality of (N+1) PMOS transistors ranging from a zeroth transistor $P8_0$ to an Nth transistor $P8_N$. The first pull-up tuning signal tunes variable-resistance transistor P8 analogously as discussed with regard to the pull-up resistance tuning of first inverter 105.

A source of inverter transistor M7 couples to ground through an NMOS pull-down transistor M9. The enable signal en drives the gate of pull-down transistor M9 so that first inverter 305 is grounded during normal operation. A variable-resistance NMOS transistor M10 couples in parallel with inverter transistor M7 between the output node for first inverter 305 and a drain of pull-down transistor M9. Variable-resistance transistor M10 is implemented by a plurality of (N+1) NMOS transistors ranging from a zeroth transistor $M10_0$ to an Nth transistor $M10_N$. The first pull-down tuning signal tunes variable-resistance transistor M10 analogously as discussed with regard to the pull-down resistance tuning of first inverter 105. The complement intermediate clock signal on the output node of first inverter 305 (the drains of inverter transistors P7 and M7) drives an input node to second inverter 315. Since the structure of second inverter 315 and its tuning duplicates that of third inverter 310, third inverter 310 will now be discussed in more detail.

Third inverter 310 includes an inverter PMOS transistor P11 having its drain connected to a drain of an inverter NMOS transistor M11. The complement input clock signal drives the gates of inverter transistors P11 and M11. The source of transistor P11 connects to the power supply node through a pull-up PMOS transistor P13. The complement enable signal enb drives the gate of transistor P13 so that third inverter 310 is powered during normal operation. A variable-resistance PMOS transistor P12 couples in parallel with inverter transistor P11 between the output node for third inverter 310 (the drains of inverter transistors P11 and M11) and the drain of pull-up transistor P13. Variable-resistance transistor P12 is implemented by a plurality of (N+1) PMOS transistors ranging from a zeroth transistor $P12_0$ to an Nth transistor $P12_N$. The second pull-up tuning signal tunes the resistance for variable-resistance transistor P12 analogously as discussed with regard to the pull-up resistance tuning of second inverter 110.

A source of inverter transistor M11 couples to ground through an NMOS pull-down transistor M12. The enable signal en drives the gate of pull-down transistor M12 so that third inverter 310 is grounded during normal operation. A variable-resistance NMOS transistor M14 couples in parallel with inverter transistor M11 between the output node for third inverter 310 and a drain of pull-down transistor M12. Variable-resistance transistor M14 is implemented by a plurality of (N+1) NMOS transistors ranging from a zeroth transistor $M14_0$ to an Nth transistor $M14_N$. The second pull-down tuning signal tunes variable-resistance transistor M14 analogously as discussed with regard to the pull-down resistance tuning of second inverter 110. The intermediate clock signal on the output node of third inverter 310 (the drains of inverter transistors P11 and M11) drives an input node to fourth inverter 320.

The tuning for fourth inverter 320 replicates the tuning applied to first inverter 305. Similarly, the tuning for second inverter 315 replicates the tuning applied to third inverter 310. A method of correcting the duty cycle for a clock signal will now be discussed.

Figure 4:
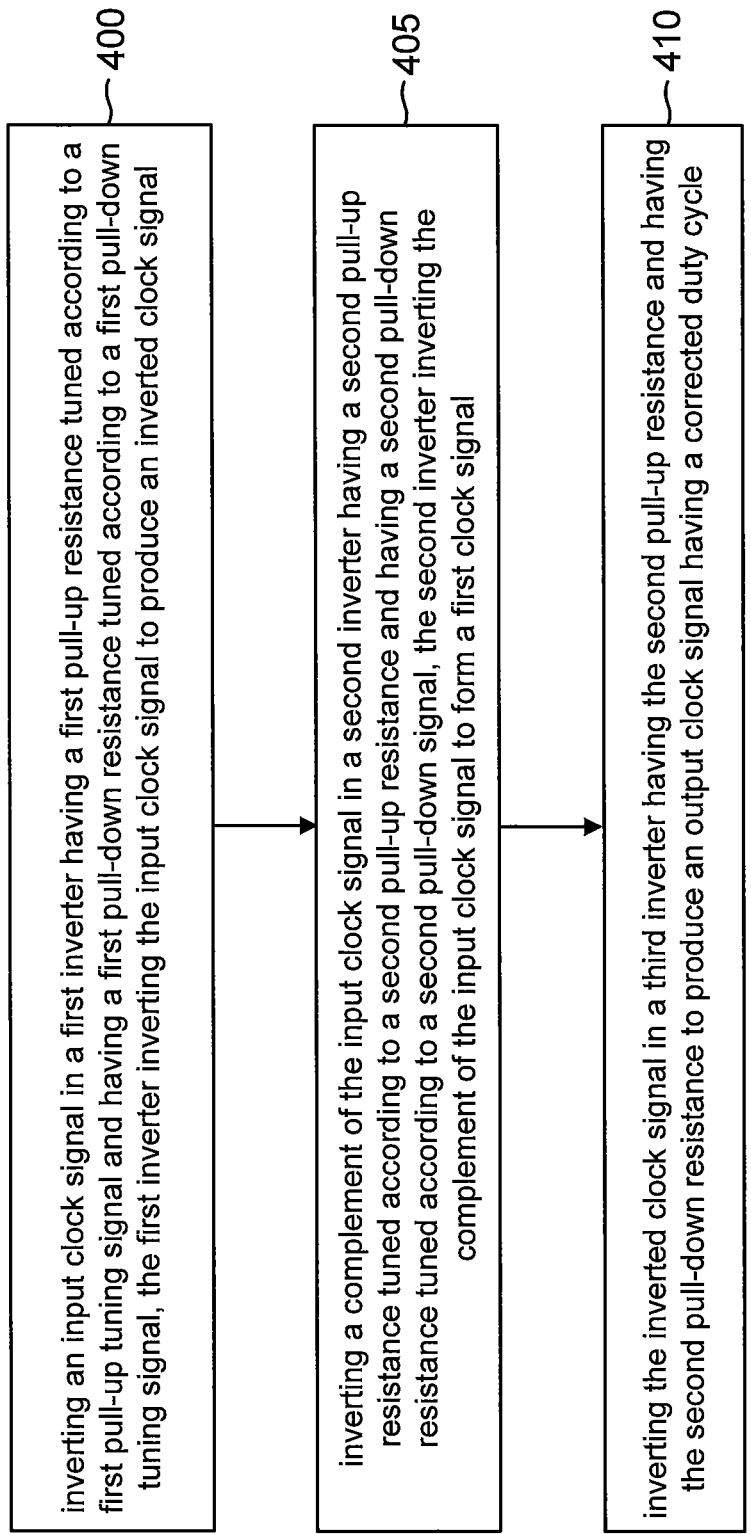
FIG. 4 is a flowchart for a duty cycle correction method in accordance with an aspect of the disclosure.

A flowchart for an example method of correcting the duty cycle for an input clock signal is shown in FIG. 4. The method includes an act 400 of inverting an input clock signal in a first inverter having a first pull-up resistance tuned according to a first pull-up tuning signal and having a first pull-down resistance tuned according to a first pull-down tuning signal, the first inverter inverting the input clock signal to produce an inverted clock signal. The inversion of the input clock signal (clk in) in either first inverter 105 of duty cycle correction circuit 200 or in first inverter 305 of duty cycle correction circuit 300 is an example of act 400. The method further includes an act 405 of inverting a complement of the input clock signal in a second inverter having a second pull-up resistance tuned according to a second pull-up resistance and having a second pull-down resistance tuned according to a second pull-down signal, the second inverter inverting the complement of the input clock signal to form a first clock signal. The inversion of the complement input clock signal (clkb in) in either second inverter 110 of duty cycle correction circuit 200 or in third inverter 310 of duty cycle correction circuit 300 is an example of act 405. Finally, the method includes an act 410 of inverting the inverted clock signal in a third inverter having the second pull-up resistance and having the second pull-resistance to produce an output clock signal having a corrected duty cycle. The inversion of the intermediate complement clock signal (clkbi) in either third inverter 210 of duty cycle correction circuit 200 or second inverter 315 in duty cycle correction circuit 300 is an example of act 410.

Figure 5:
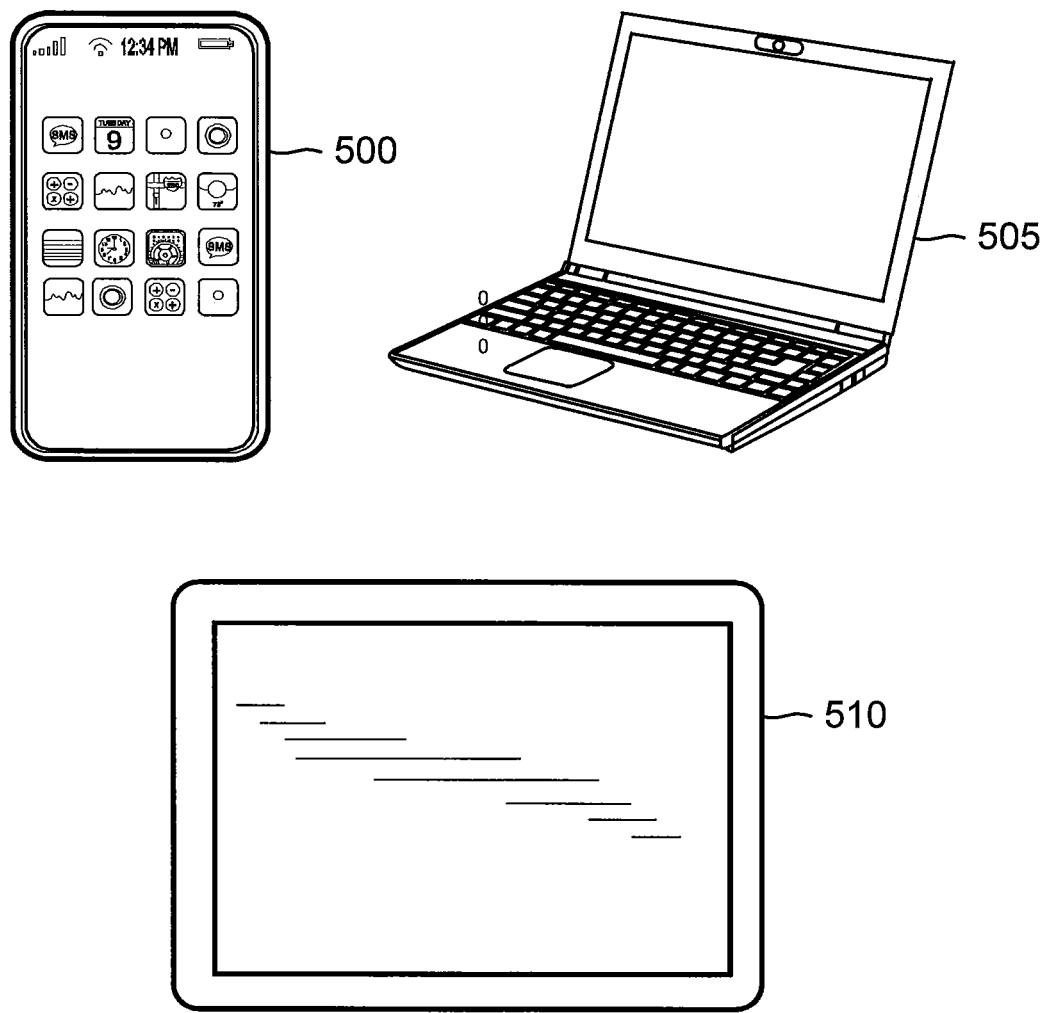
FIG. 5 illustrates some example electronic systems incorporating a duty cycle correction circuit in accordance with an aspect of the disclosure.

The duty cycle correction circuit as disclosed herein may be incorporated into a wide variety of electronic systems. For example, as shown in FIG. 5, a cell phone 500, a laptop 505, and a tablet PC 510 may all include a duty cycle correction circuit constructed in accordance with the disclosure. Other exemplary electronic systems such as a music player, a video player, a communication device, and a personal computer may also be configured with duty cycle correction circuits constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A duty cycle correction circuit, comprising:
    a first inverter having a first pull-up resistance responsive to a first pull-up tuning signal and having a first pull-down resistance responsive to a first pull-down tuning signal, the first inverter configured to invert an input clock signal to produce an inverted clock signal having a duty cycle that is adjusted by a first factor with respect to an uncorrected duty cycle for the input clock signal;
a second inverter having a second pull-up resistance responsive to a second pull-up tuning signal and having a second pull-down resistance responsive to a second pull-down tuning signal, the second inverter configured to invert a complement of the input clock signal to produce a first clock signal having a duty cycle that is adjusted by a complement of the first factor with respect to an uncorrected duty cycle for the complement of the input clock signal;
a third inverter having the second pull-up resistance and the second pull-down resistance, the third inverter configured to invert the inverted clock signal to produce an output clock signal having a corrected duty cycle; and
a fourth inverter having the first pull-up resistance and the first pull-down resistance, the fourth inverter configured to invert the first clock signal to produce a complement output clock signal.

2. The duty cycle correction circuit of claim 1, wherein the first inverter includes an inverter p-type metal-oxide semiconductor (PMOS) transistor coupled in series with an inverter n-type metal-oxide semiconductor (NMOS) transistor, wherein the first inverter further includes a variable-resistance PMOS transistor coupled between a source of the inverter PMOS transistor and a power supply node, and wherein a variable resistance for the variable-resistance PMOS transistor is responsive to the first pull-up tuning signal.

3. The duty cycle correction circuit of claim 2, wherein the first inverter further includes a variable-resistance NMOS transistor coupled between a source of the inverter NMOS transistor and ground, and wherein a variable resistance for the variable-resistance NMOS transistor is responsive to the first pull-down tuning signal.

4. The duty cycle correction circuit of claim 3, wherein the variable-resistance PMOS transistor comprises a plurality of PMOS transistors arranged in parallel, and wherein the first pull-up tuning signal is a digital word comprising a plurality of bits corresponding to the plurality of PMOS transistors arranged in parallel, and wherein the variable-resistance NMOS transistor comprises a plurality of NMOS transistors arranged in parallel, and wherein the first pull-down tuning signal is a digital word comprising a plurality of bits corresponding to the plurality of NMOS transistors arranged in parallel.

5. The duty cycle correction circuit of claim 3, wherein the variable-resistance PMOS transistor is coupled in parallel with a pull-up PMOS transistor configured to respond to a complement enable signal, and wherein the variable-resistance NMOS transistor is coupled in parallel with a pull-down NMOS transistor configured to respond to an enable signal, and wherein the complement enable signal is a complement of the enable signal.

6. The duty cycle correction circuit of claim 1, wherein the first inverter includes an inverter p-type metal-oxide semiconductor (PMOS) transistor coupled in series with an inverter n-type metal-oxide semiconductor (NMOS) transistor, and wherein the first inverter further includes a variable-resistance PMOS transistor coupled in parallel with the inverter PMOS transistor, and wherein a variable resistance for the variable-resistance PMOS transistor is responsive to the first pull-up tuning signal.

7. The duty cycle correction circuit of claim 6, wherein the first inverter further includes a variable-resistance NMOS transistor coupled in parallel with the inverter NMOS transistor, and wherein a variable resistance for the variable-resistance NMOS transistor is responsive to the first pull-down tuning signal.

8. The duty cycle correction circuit of claim 7, wherein the variable-resistance PMOS transistor comprises a plurality of PMOS transistors arranged in parallel, and wherein the first pull-up tuning signal is a digital word comprising a plurality of bits corresponding to the plurality of PMOS transistors arranged in parallel, and wherein the variable-resistance NMOS transistor comprises a plurality of NMOS transistors arranged in parallel, and wherein the first pull-down tuning signal is a digital word comprising a plurality of bits corresponding to the plurality of NMOS transistors arranged in parallel.

9. The duty cycle correction circuit of claim 7, wherein a source for the inverter PMOS transistor and a source for the variable-resistance PMOS transistor both couple through a pull-up PMOS transistor to a power supply node, and wherein a source for the inverter NMOS transistor and a source for the variable-resistance NMOS transistor both couple to ground through a pull-down NMOS transistor.

10. The duty cycle correction circuit of claim 9, wherein the pull-up PMOS transistor is configured to switch on responsive to a complement enable signal, and wherein the pull-down NMOS transistor is configured to switch on responsive to an enable signal, and wherein the complement enable signal is a complement of the enable signal.

11. The duty cycle correction circuit of claim 1, wherein the duty cycle correction circuit is incorporated in a cellular telephone.

12. A method of duty cycle correction, comprising:
inverting an input clock signal in a first inverter having a first pull-up resistance tuned according to a first pull-up tuning signal and having a first pull-down resistance tuned according to a first pull-down tuning signal, the first inverter inverting the input clock signal to produce an inverted clock signal having a duty cycle adjusted by a first factor with respect to an uncorrected duty cycle for input clock signal;
inverting a complement of the input clock signal in a second inverter having a second pull-up resistance tuned according to a second pull-up tuning signal and having a second pull-down resistance tuned according to a second pull-down tuning signal, the second inverter inverting the complement of the input clock signal to form a first clock signal having a duty cycle adjusted by a complement of the first factor with respect to an uncorrected duty cycle for complement of the input clock signal;
inverting the inverted clock signal in a third inverter having the second pull-up resistance and having the second pull-down resistance to produce an output clock signal having a corrected duty cycle; and
inverting the first clock signal in a fourth inverter having the first pull-up resistance and the first pull-down resistance to produce a complement output clock signal having the corrected duty cycle.

13. The method of claim 12, further comprising:
increasing both the first pull-up resistance from a default value and the second pull-down resistance from a default value responsive to a duty cycle for the input clock signal being less than a desired value.

14. The method of claim 13, further comprising:
maintaining both the first pull-down resistance at a default value and the second pull-up resistance at a default value responsive to the duty cycle for the input clock signal being less than the desired value.

15. The method of claim 12, further comprising:
increasing both the first pull-down resistance from a first default value and the second pull-up resistance from a second default value responsive to a duty cycle for the input clock signal being greater than a desired value.

16. The method of claim 15, further comprising:
maintaining both the first pull-up resistance at a third default value and the second pull-down resistance at a fourth default value responsive to the duty cycle for the input clock signal being greater than the desired value.

17. A duty cycle correction circuit, comprising:
a first inverter having a first variable pull-up resistance responsive to a first pull-up tuning signal to increase the first variable pull-up resistance from a default pull-up value and having a first variable pull-down resistance responsive to a first pull-down signal, wherein the first variable pull-down resistance equals a default pull-down value, the first inverter configured to invert an input clock signal to produce a first inverted clock signal; and
a second inverter having a second variable pull-up resistance responsive to a second pull-up tuning signal and having a second variable pull-down resistance responsive to a second pull-down signal to increase the second variable pull-down resistance from the default pull-down value, wherein the second variable pull-up resistance equals the default pull-up value, the second inverter configured to invert the first inverted clock signal to produce an output clock signal having a corrected duty cycle.

18. The duty cycle correction circuit of claim 17, wherein the first inverter includes a first variable-resistance PMOS transistor responsive to the first pull-up tuning signal to tune the first variable pull-up resistance and includes a first variable-resistance NMOS transistor responsive to the first pull-down tuning signal to tune the first variable pull-down resistance.

19. The duty cycle correction circuit of claim 18, wherein the second inverter includes a second variable-resistance PMOS transistor responsive to the second pull-up tuning signal to tune the second variable pull-up resistance and includes a second variable-resistance NMOS transistor responsive to the second pull-down tuning signal to tune the second variable pull-down resistance.

20. The duty cycle correction circuit of claim 17, wherein the duty cycle correction circuit is incorporated into a cellular telephone.

\* \* \* \* \*